(12) United States Patent  
Hooker et al.

(10) Patent No.: US 6,193,801 B1  
(45) Date of Patent: Feb. 27, 2001

(54) APPARATUS FOR COATING LENTICULAR ARTICLES

(75) Inventors: Daniel Roy Hooker, Poughauag; Daniel Matthew Hogan, Centereach, both of NY (US); Vincent O. Scarnecchia, Dennis, MA (US)

(73) Assignee: Semi-Alloys Company, Mount Vernon, NY (US)

( * ) Notice: Subject to any disclaimer, the term of this patent is extended or adjusted under 35 U.S.C. 154(b) by 0 days.

(21) Appl. No.: 09/389,330

(22) Filed: Sep. 3, 1999

Related U.S. Application Data

(62) Division of application No. 08/846,064, filed on Apr. 25, 1997, now Pat. No. 6,017,581.

(51) Int. Cl.[7] .............................. C23C 16/00; C23C 14/00
(52) U.S. Cl. ...................... 118/500; 118/728; 204/298.15
(58) Field of Search .................................. 118/728, 500, 118/502, 503; 204/298.15

(56) References Cited

U.S. PATENT DOCUMENTS

| | | | |
|---|---|---|---|
| 3,818,982 | * | 6/1974 | Wagner ................................. 165/86 |
| 4,237,183 | * | 12/1980 | Fujiwara et al. ..................... 428/336 |
| 4,643,128 | * | 2/1987 | Bracher et al. ...................... 118/503 |
| 4,817,559 | * | 4/1989 | Ciparisso ............................. 118/731 |
| 5,124,019 | * | 6/1992 | Kunkel et al. .................. 204/298.15 |
| 5,138,974 | * | 8/1992 | Ciparisso ............................. 118/731 |
| 5,325,812 | * | 7/1994 | Thiebaud et al. .................... 118/500 |
| 5,380,551 | * | 1/1995 | Blonder et al. ....................... 427/166 |
| 5,597,609 | * | 1/1997 | Beisswenger et al. .................. 427/8 |
| 5,660,693 | * | 8/1997 | Abramson et al. ............. 204/192.12 |
| 6,017,581 | * | 1/2000 | Hooker et al. ........................ 427/166 |

* cited by examiner

Primary Examiner—Jeffrie R. Lund  
(74) Attorney, Agent, or Firm—Gottlieb, Rackman & Reisman

(57) ABSTRACT

A fixture for releasable retaining at least one lenticular article in a fixed orientation while the article(s) is/are being subjected to one or more applications of a thin film coating process comprises a perforated metallic sheet having at least one aperture therein adapted to receive the article(s). The thickness of the metal fixture bears a ratio to the size of the articles being retained that is within a particular range. A method for applying thin film optical coatings to lenticular articles utilizing such a fixture is also disclosed.

12 Claims, 3 Drawing Sheets

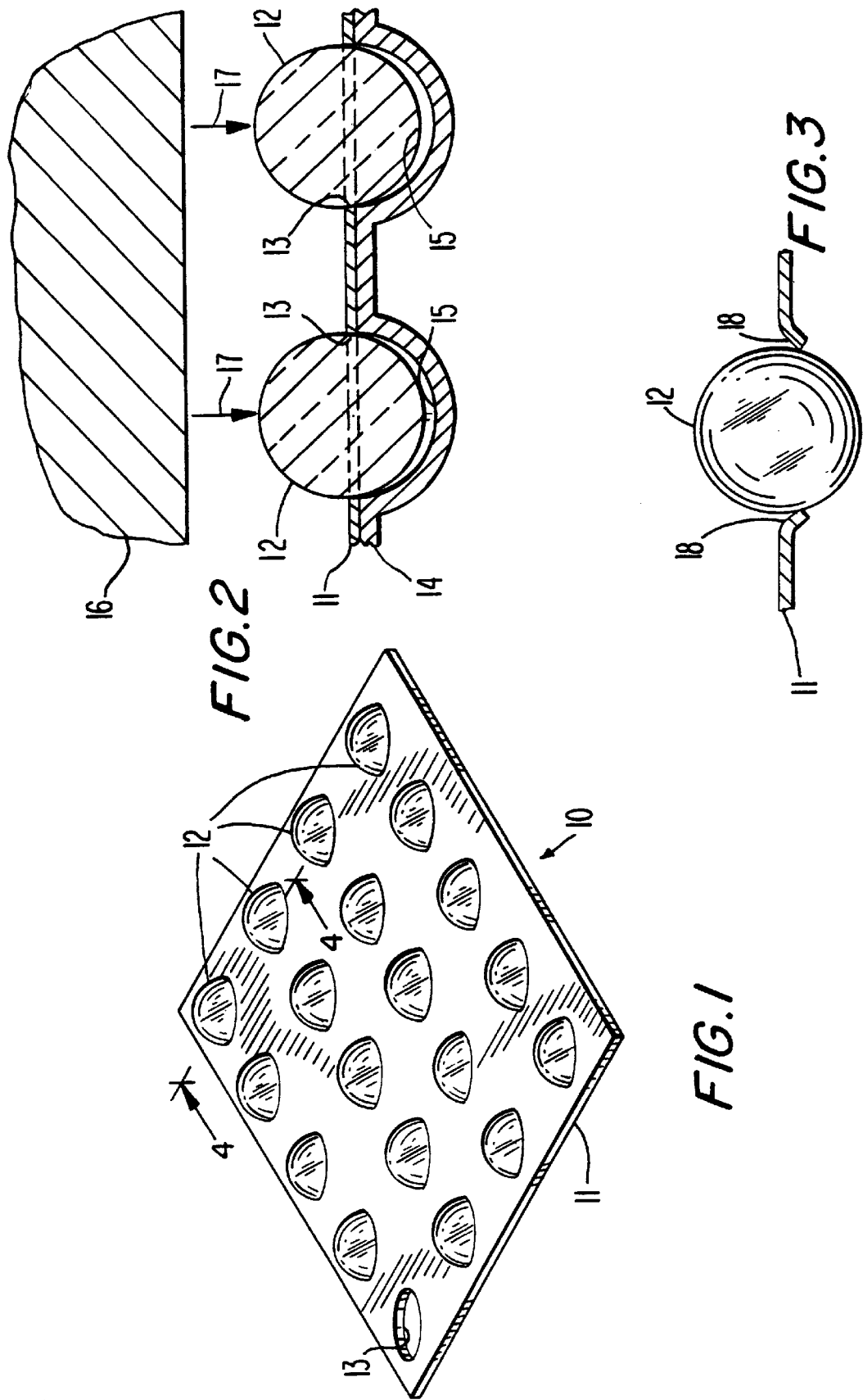

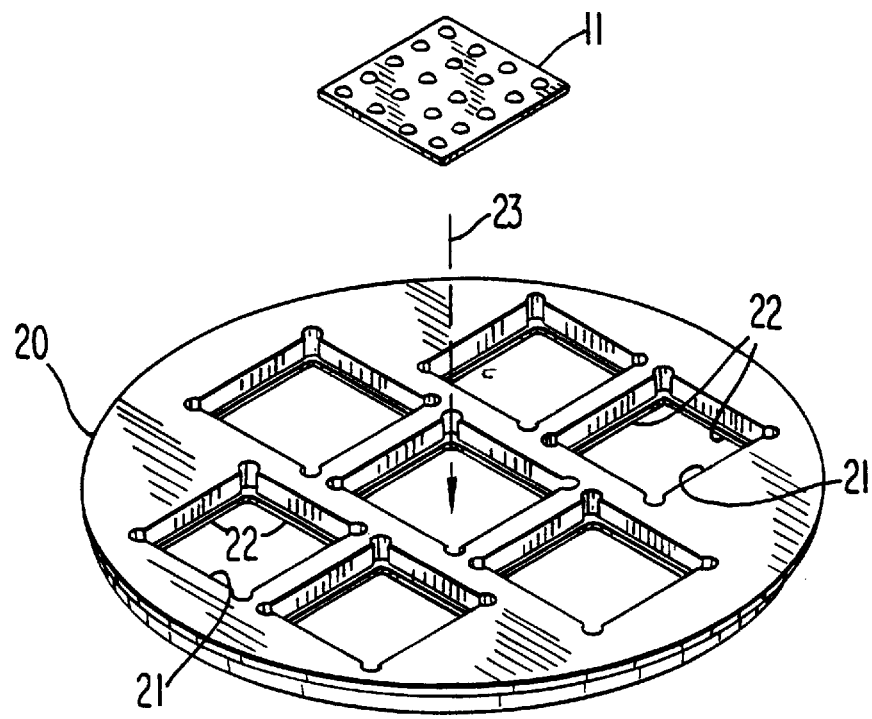
FIG.5
FIG.4
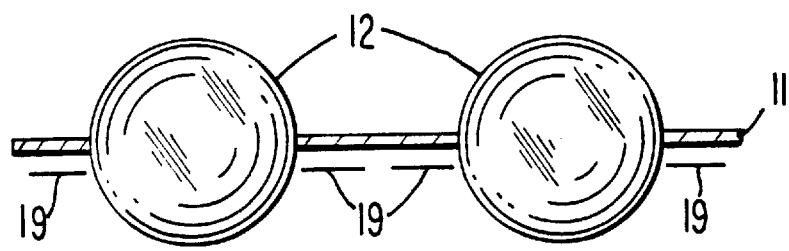
FIG.4a
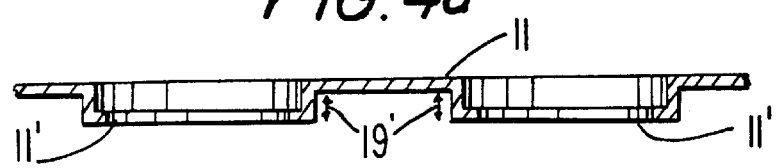

APPARATUS FOR COATING LENTICULAR ARTICLES

This application is a division of application Ser. No. 08/846,064, now U.S. Pat. No. 6,017,581 filed Apr. 25, 1997.

FIELD OF THE INVENTION

This invention relates generally to the coating of lenticular articles for use in the electronics and opto-electronics industries. In particular, this invention relates to an improved apparatus for retaining such articles during the coating process, and to an improved coating method which utilizes that apparatus. More particularly, this invention relates to a metallic fixture adapted to releasable retain one or more lenticular articles in a fixed orientation while the coating is being applied, and to continue to retain them thereafter, during the course of subsequent processing and handling.

BACKGROUND OF THE INVENTION

In the electronics and opto-electronics industries, there are many products (such as sensors and fiber optic components of medical and other devices) in which transparent objects of various shapes, e.g., spheres, are used as lenticular articles in order to transmit or reflect light rays and at the same time to produce a convergent or divergent effect on the light rays that are transmitted or reflected. Such lenticular articles (also referred to hereinafter as "lenses") are typically comprised of glass, plastic, or crystalline substrate materials, and often a thin film optical coating must be applied to the substrate in order to enhance or vary the transmissive or reflective properties of these lenses in particular desired ways. Such thin film coatings usually constitute dielectric and/or metallic materials, and they are conventionally applied to the lens substrate in one or more layers.

Both high temperature and low temperature processes for applying thin film optical coatings to glass and to other lenticular substrate materials are known in the art. However, for some substrates it is also known that the low temperature coating processes are not as efficient as those which utilize high temperatures, and accordingly, for those substrates the latter processes are generally preferred. Yet the prior art has not dealt, at least not in a satisfactory way, with the need to releasably immobilize the lenses while they are being subjected to the fluctuations in temperature that result when a thin film coating is applied using a high temperature coating process. Moreover, regardless of whether a high temperature coating process or a low temperature coating process is used, the prior art has failed to address the need to releasably immobilize the lenses, both during the coating process and thereafter, especially when such lenses cannot be manipulated easily by hand (due to their size and/or shape) and also when they must be coated on more than one side, thus requiring that they be subjected to multiple applications of the coating process.

It is therefore the principal object of the present invention to provide an apparatus for releasably retaining one or more lenses in a fixed orientation while a thin film coating is being applied, thereby overcoming the disadvantages of the prior art.

SUMMARY OF THE INVENTION

In accordance with the invention, a fixture adapted to releasably retain one or more lenticular articles in a fixed orientation, while they are being subjected to one or more applications of a thin film coating process, is provided. The fixture is fabricated of metal, specifically, of iron-nickel-cobalt or iron-nickel alloys, and for most applications the thickness of the metal fixture bears a ratio to the size of the lenses being retained that is within a particular range. The fixture is perforated with apertures of the appropriate size and shape to enable the lens(es) to be accommodated therein in a friction fit.

It is a feature of this invention that it provides a fixture which may accommodate many different lens shapes, and which can also function as a convenient holder to protect and to releasably retain the lens(es) not only during the coating process but also during subsequent steps in the manufacturing and distribution process, until each lens is ultimately needed for use in its intended application, at which time the fixture can also function as a dispenser, allowing automated removal of the lens(es) therefrom and simultaneous placement or insertion of the lens(es) into another holder or into a connecting device.

These and other objects, features and advantages of the present invention will become more apparent from the detailed description of the preferred embodiments thereof, when read in conjunction with the accompanying drawings, wherein:

FIG. 1 is a perspective view of a fixture fabricated in accordance with the present invention, showing a plurality of spherical lenses retained therein for the application of a thin film optical coating;

FIG. 2 is an enlarged cross-sectional view, illustrating in a schematic fashion the manner in which spherical lenses may be inserted within the fixture of the invention so as to achieve the structure shown in FIG. 1;

FIG. 3 is an enlarged cross-sectional view of a fixture that is not fabricated in accordance with the invention, showing the deflectional deformation thereof;

FIG. 4 is an enlarged cross-sectional view, taken substantially along the line 4—4 of FIG. 1;

FIG. 4a is an enlarged cross-sectional view, similar to FIG. 4, but illustrating the fixture without any lenses inserted therein, and with the addition of a shelf means according to an alternative embodiment of the invention;

FIG. 5 is a perspective view, illustrating in a schematic fashion how an illustrative fixture with spherical lenses retained therein in accordance with the invention, may be inserted into a holder therefor prior to subjecting the lenses to a thin film coating process;

DESCRIPTION OF THE PREFERRED EMBODIMENTS

Figure 8:
FIGS. 8–10 are cross-sectional views illustrating fixtures in accordance with other embodiments of the invention, showing lenses of different, i.e., non-spherical, shapes retained therein.

Referring now to the drawings, and in particular to FIG. 1, an apparatus for releasably retaining one or more lenses in accordance with the invention is generally designated 10. Apparatus 10 comprises a fixture 11 which, for illustrative purposes only, is shown in the drawings as being rectangular in shape. However, it is to be understood that other geometric, or even non-geometric, shapes may be utilized.

Fixture 11 is adapted to releasably retain one or more lenses in a fixed orientation. As shown in FIG. 1, fixture 11 accommodates a plurality of lenses 12, illustratively substantially spherical in shape, that are arranged in a grid pattern consisting of five rows and four columns; however, it is to be understood that this arrangement is for illustrative purposes only, and that neither the number nor the grid pattern in which they are arranged is critical to the invention. Thus, the number of lenses and the grid pattern can vary, depending upon the size and shape of the fixture 11, and also depending upon the size and shape of the lenses themselves.

Referring now to FIGS. 2–7 in addition to the aforementioned FIG. 1, preferably the lenses retained in a given fixture 11 are all substantially identical in shape and in size. For many common electronic and opto-electronic applications, a substantially spherical shape is required, with diameters ranging from about 0.4 millimeters to about 150 millimeters, and typically from about 1 millimeter to about 3 millimeters; thus the invention and its manner of use are illustrated in FIGS. 1–7 in conjunction with spherical lenses 12. However, as mentioned hereinbelow, the present invention may also be utilized with lenses having other shapes.

Preferably, the lenses retained in a given fixture 11 are also all substantially identical in composition; commonly, for electronic and opto-electronic applications, monocrystalline aluminum oxide, having the chemical formula $Al_2O_3$ and known in the industry as "sapphire," is used. However, the invention may also be used with lenses composed of other substrate materials, including silicate glasses, quartz glasses, plastic or resinous materials such as polycarbonates and polyolefins (e.g., polystyrene and acrylics such as polymethylmethacrylate), and crystalline materials such as zinc selenide, cadmium telluride, lithium niobate, potassium bromide and cubic zirconia.

As shown best in FIG. 1, fixture 11 is provided with one or more perforations or apertures 13, each of which is adapted to receive a lens across a retainable dimension of the lens in a friction fit. In the cases in which the lenses are substantially spherical in shape (as shown illustratively in the drawings), the apertures 13 must accordingly be substantially circular in shape in order to accommodate them and, as will be evident, the retainable dimension, i.e., the dimension across which each spherical lens 12 is retained in an aperture 13, is a diameter thereof. In order to attain a friction fit, the size of aperture 13 (illustratively, the diameter of the circular opening) is chosen to be between about 0.0127 millimeters and about 0.0254 millimeters smaller than the retainable dimension of the lens that is to be retained in fixture 11. Preferably, apertures 13 are formed in fixture 11 utilizing a conventional metal stamping process.

Fixture 11 must be composed of a material that has a coefficient of thermal expansion which closely matches the coefficient of thermal expansion of the lenticular articles that are to be coated. The material used for fixture 11 must also be soft enough to avoid damage to the lenses when they are being mounted or inserted therein, yet hard enough to retain and immobilize them thereafter. In accordance with the invention, fixture 11 comprises a perforated metallic sheet, most preferably composed of a material meeting the ASTM F 15 standard, as published from time to time by the American Society for Testing and Materials of Philadelphia, Pa. This material is an alloy, the primary constituents of which are iron, nickel and cobalt, and such a material is commercially available from Carpenter Technology Corporation of Reading, Pa., under the name KOVAR (KOVAR is a registered trademark of CRS Holding, Inc.). It is also within the scope of this invention to fabricate fixture 11 from a material meeting the ASTM F 30 standard, also as published from time to time by the American Society for Testing and Materials. This material is also an alloy, the primary constituents of which are iron and nickel, and such a material is also commercially available from Carpenter Technology Corporation under the name Alloy 42. Both KOVAR and Alloy 42 have a low coefficient of thermal expansion that is similar to both that of sapphire and that of glass.

Although the shape and lateral dimensions of fixture 11 are not critical to the invention, the thickness of the sheet of metallic alloy that comprises fixture 11 must be chosen carefully. Specifically, except as specified hereinbelow, the ratio of the thickness of fixture 11 to the retainable dimension of the lenses to be retained should be in the range of from about 1:400 to about 1:4, and preferably should be in the range of from about 1:12.5 to about 1:4.15.

FIG. 2 illustrates in schematic form the preferred manner in which spherical lenses 12 composed of glass or sapphire may be inserted within the fixture 11 of the invention prior to the application of a thin film optical coating. Spheres 12 are first located such that each sphere rests loosely within an aperture 13. However, since the diameter of each aperture 13 is slightly smaller than the diameter of each sphere 12, at this stage a slightly larger portion of each sphere 12 remains above the plane of fixture 11 than protrudes below the plane of fixture 11, as shown in FIG. 2.

Thereafter, sufficient force must be applied to seat each sphere within the corresponding aperture 13, and this may be accomplished in any conventional manner known in the art. For example, and as illustrated in FIG. 2, stop means such as a die 14 having cavities 15 of the appropriate size and shape (illustratively hemispherical) may be provided and may be positioned adjacent the underside of fixture 11. This assemblage may then be placed in a conventional mechanical press (not shown) equipped with a plunger 16, following which pressure may be applied to the plunger 16 so as to urge it (in the direction of arrows 17) against spheres 12, thereby forcing spheres 12 into fixture 11, with die 14 serving as a stop means to facilitate proper seating of spheres 12 in apertures 13 and to prevent spheres 12 from being forced all the way through and out the other side of fixture 11.

Subsequently, as shown best in FIG. 4, spheres 12 are releasably retained in fixture 11, with each sphere retained substantially across an equatorial diameter thereof. In the absence of stop means such as die 14, the application of pressure by plunger 16 against spheres 12 may result in some undesirable deflectional deformation of fixture 11, as shown at 18 in FIG. 3, which will, in turn, prevent spheres 12 from being retained substantially equatorially.

The same undesirable deflectional deformation of fixture 11 can occur if aperture 13 is more than about 0.0254 millimeters smaller than the retainable dimension of the lens. However, if a stop means is used, and if aperture 13 is not too small, the deflectional deformation shown in FIG. 3 is avoided; instead, fixture 11 deforms in a permissible way, i.e., laterally, in the direction shown by the arrows 19 in FIG. 4.

Although the foregoing method of insertion is preferred for lenses composed of relatively hard and durable substrate materials (such as silicate glass or sapphire), for substrate materials that are more fragile (e.g., for the crystalline materials mentioned hereinabove) a different method of insertion, and a modified structure for fixture 11, are preferred. Specifically, each aperture 13 of fixture 11 is preferably formed with integral but offset shelf means, e.g., a small peripheral lip extending inwardly from the outer edge of each aperture 13 and situated below the plane passing through the body of fixture 11, as shown in an illustrative fashion in FIG. 4a. The shelf means 11' may be formed in fixture 11 using a conventional metal drawing operation or a conventional metal stamping operation, and preferably its dimensions are chosen so as to allow the fragile lens(es) to be pressed lightly into the fixture, using manual pressure. The shelf means will also function as a mask, i.e., it will block the application of the thin film optical coating to the periphery of the lenticular article(s) being retained. The shelf means preferably extends inwardly from the outer edge of each aperture 13 by an amount that will range from about 0.5 millimeters (i.e., about 0.02 inches) to about 1.5 millimeters (about 0.06 inches), depending upon the degree of masking that is desired.

A fixture formed with offset shelf means may even be utilized for retention of lenses which are composed of the non-fragile substrate materials, but which, due to their size and/or shape (e.g., very thin disks) or for other reasons, cannot be accommodated by a fixture 11 formed with the type of aperture 13 that is shown in FIG. 1. Specifically, for a lenticular article that is a cylindrical solid, with a height ranging from about 2 millimeters to about 5 millimeters, and having a diameter which is at least twice its height (such lenticular articles will hereinafter be referred to as "disk-like lenticular articles" or "disk-like lenses"), the apertures 13 of fixture 11 are preferably formed with offset shelf means. Moreover, for such disk-like lenses, the thickness of the body of fixture 11 can not be calculated according to the formula set forth hereinabove (in which the thickness of the fixture bears a ratio to the retainable dimension of the lens(es) to be retained). Instead, for such disk-like lenses the thickness of the body of the fixture will not be a relative value, but will be an absolute value ranging from about 0.228 millimeters (about 0.009 inches) to about 0.280 millimeters (about 0.011 inches), and will preferably be about 0.254 millimeters (about 0.01 inches). However, as set forth above, the shelf means facilitates insertion of the disk-like lenticular articles into the fixture, allowing them to be pressed lightly into the fixture using manual pressure.

As will be apparent to those skilled in the art, the use of conventional metal-shaping processes to form the shelf means for each aperture 13 will cause the peripheral lip comprising the shelf means to have the same thickness as the body of the fixture 11 itself (e.g., about 0.01 inches). However, according to the invention, the distance by which the plane passing through the shelf means will be offset from the plane passing through the body of the fixture will vary directly with the thickness of the disk-like lens(es) to be coated, preferably in a 1:4 ratio (this offset distance is indicated by the arrows 19' in FIG. 4a). For special cases in which the thickness of the disk-like lens(es) must be less than 2 millimeters, the aforementioned ratio is maintained by reducing the thickness of fixture 11 still further, e.g., for disk-like lenses that are about one millimeter thick, the fixture may be in the range of from about 0.100 millimeters (about 0.004 inches) to about 0.155 millimeters (about 0.006 inches) thick, and preferably about 0.127 millimeters (about 0.005 inches) thick, and the offset will therefore be no less than about 0.25 millimeters (about 0.01 inches), thereby accommodating the practical limitations imposed by current metal shaping technology.

Although the use of shelf means with fixture 11 for retention of disk-like lenses composed of non-fragile substrate materials has been described hereinabove only with respect to disk-like lenses that are cylindrical solids and therefore have substantially circular cross-sections, and although the shelf means is shown in t he drawings only in conjunction with apertures 13 that are illustratively circular, it should be understood that such shelf means can be utilized according to the same principles to facilitate the insertion into a fixture 11 of thin lenticular articles having different cross-sectional configurations, e.g., disk-like lenticular articles that are rectangular solids. It is to be understood, therefore, that as used herein the terms "disk-like lenticular articles" and "disk-like lenses" refer to lenticular articles that are less than about 5 millimeters thick, regardless of their cross-sectional configurations.

Following insertion of the lenses into fixture 11 in one of the ways described hereinabove, each of the lenses is releasably retained therein, but is substantially immobilized in a fixed orientation. As shown in FIG. 5, fixture 11 may then be placed into an appropriate holder 20, having one or more openings 21 the shape and size of which are chosen so as to accommodate the shape and size of fixture 11. Openings 21 are preferably provided with beveled edges 22, enabling a fixture 11 to be lowered into holder 20 in the direction of arrow 23 in FIG. 5, and to be seated within one of the openings 21 without falling through. As shown in the drawing, each fixture 11 is thereafter oriented in a plane which is substantially parallel to the plane passing through holder 20.

Subsequently, this assemblage may be placed within a conventional reaction chamber (not shown) and subjected to any one of a variety of vacuum deposition coating processes that are known in the art, in which thin layers of one or more materials are deposited upon a substrate by exposing the substrate to the vaporized material(s) to be deposited under controlled conditions in conventional reactor chambers. To achieve certain desirable film properties, the substrates are often heated during the coating process to temperatures in the range of about 200° C.–400° C. Examples of such vacuum deposition coating processes include thermal evaporation techniques, such as resistance heating, electron beam evaporation, laser ablation and ion assisted evaporation, as well as physical plasma deposition techniques, such as diode sputtering, magnetron sputtering, radio frequency diode sputtering and ion beam sputtering. As mentioned hereinabove, however, although the fixture of the invention can be used most beneficially with a high temperature coating process, it can also be used to advantage even with a low temperature coating process (i.e., a process in which the temperature of the substrate does not exceed about 200° C.), such as ion beam assisted deposition and physical sputtering.

Figure 6:
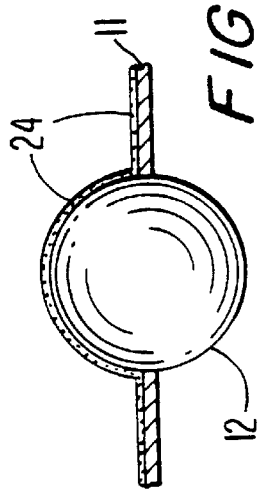
FIG. 6 is an enlarged cross-sectional view, similar to FIG. 4, but illustrating only on e spherical lens, and showing a thin film coating applied to one hemisphere thereof.
Figure 7:
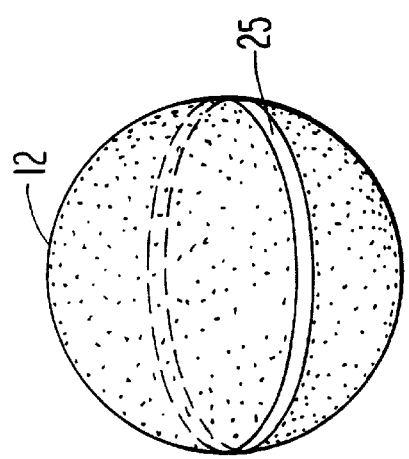
FIG. 7 is a further enlarged, perspective view of a single spherical lens, after substantially both hemispheres thereof have been coated using the fixture of the invention.

The use of one of these coating techniques results initially in the application of a thin film coating to only one side of each of the lenses (as well as to only one side of fixture 11). Thus, as shown in FIG. 6 (which is not drawn to scale), when the lenses 12 are illustratively spherical, a thin film coating 24 is initially applied to substantially one hemisphere thereof. For some applications, a coating on only one side of the lens (e.g., on only one hemisphere of a spherical lens) is all that is needed. However, for other applications it is often required that the lens be coated substantially on both sides. The fixture of the invention accommodates this need without requiring any re-positioning of each of the lenses individually, which is time-consuming and labor-intensive, and which can easily result in positioning errors or even damage to the lens(es). Instead, fixture 11 can simply be removed from holder 20, and then turned over and re-inserted in holder 20, following which a thin film coating can be applied again, to the other side, using the same (or even a different) vacuum deposition method. Subsequently, when each lens is ultimately released from fixture 11 for use in its intended application, virtually the entire outer surface of the lens will have received a thin film coating, except for a relatively small area that was covered by fixture 11. As shown in FIG. 7, for spherical lenses 12 this uncoated area comprises a narrow, substantially equatorial band 25.

Figure 9:
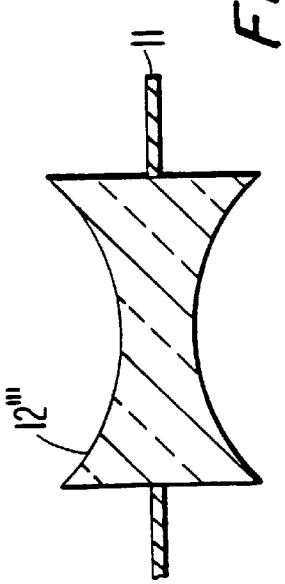
Figure 10:
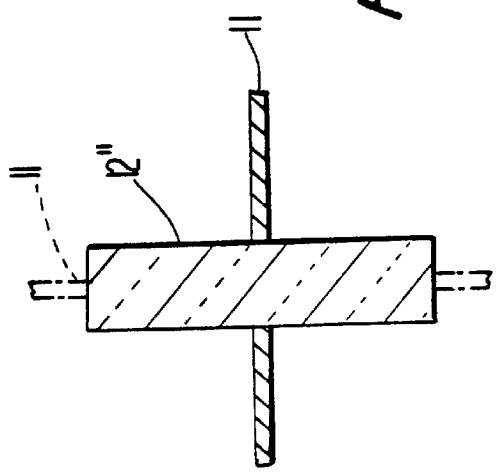

As mentioned hereinabove, and referring now to FIGS. 8–10 of the drawings in addition to the aforementioned FIGS. 1–7, the fixture of the invention may be used to releasably retain lenses of various non-spherical shapes. For example, the lenses can be hemispheres 12' (as shown in FIG. 10), or they can be cylindrical solids 12'' (in which the height of the cylindrical solid exceeds its diameter, as shown in FIG. 8), or they can have various other lens-like shapes, such as cylindrical solids with convex or concave end surfaces (not shown), or prisms (not shown), or rectangular solids with either flat or convex surfaces (not shown), or rectangular solids 12''' with concave surfaces (as shown in FIG. 9). Some lens shapes may have more than one retainable dimension, and for those shapes it may therefore be possible to insert the lenses into a fixture 11 in more than one orientation, depending upon the surface(s) thereof that require the application of the thin film optical coating (which in turn depends upon the application in which they will be used). Two exemplary alternate orientations for rod-like lenses 12'' in fixture 11 are shown by the solid and phantom lines in FIG. 8; in each case a different retainable dimension of the lens 12'' is utilized.

While there has been described what is at present considered to be the preferred embodiments of the present invention, it will be obvious to those skilled in the art that various changes and modifications may be made therein, without departing from the invention, and it is, therefore, aimed in the appended claims to cover all such changes and modifications as may fall within the true spirit and scope of the invention.

What is claimed is:

1. A fixture for releasably retaining at least one lenticular article while said article is being subjected to fluctuations in temperature, said fixture comprising a sheet composed of a metallic alloy selected from the group consisting of materials meeting the ASTM F 15 standard and materials meeting the ASTM F 30 standard, said sheet having at least one aperture formed therein, said at least one aperture being adapted to engage said at least one article across a retainable dimension thereof in a friction fit, the thickness of said sheet bearing a ratio to said retainable dimension that is in the range of from about 1:400 to about 1:4.

2. The fixture of claim 1 wherein said at least one article substantially comprises sapphire.

3. The fixture of claim 2 wherein said at least one article is substantially spherical in shape and wherein said retainable dimension comprises a diameter thereof.

4. The fixture of claim 3 wherein said metallic alloy comprises a material meeting the ASTM F 15 standard.

5. The fixture of claim 4 wherein said ratio is in the range of from about 1:12.5 to about 1:4.15.

6. The fixture of claim 2 wherein said at least one article is substantially hemispherical in shape and wherein said retainable dimension comprises a diameter thereof.

7. The fixture of claim 2 wherein said at least one article is substantially cylindrical in shape with substantially flat end surfaces.

8. The fixture of claim 2 wherein said at least one article comprises a substantially rectangular solid.

9. The fixture of claim 8 wherein each of two opposing surfaces of said rectangular solid has a shape that is chosen from the group consisting of concave and convex.

10. The fixture of claim 1 wherein said fluctuations in temperature are the result of subjecting said at least one article to a coating process.

11. A fixture for releasably retaining at least one disk-like lenticular article while said article is being subjected to fluctuations in temperature, said fixture comprising a sheet composed of a metallic alloy selected from the group consisting of materials meeting the ASTM F 15 standard and materials meeting the ASTM F 30 standard, said sheet having at least one aperture formed therein, said at least one aperture being adapted to engage said at least one article in a friction fit, said fixture further comprising offset shelf means for each said at least one aperture, said shelf means being offset from the body of said fixture by an amount which bears a ratio to the thickness of said article of about 1:4.

12. The fixture of claim 11 wherein said fluctuations in temperature are the result of subjecting said at least one article to a coating process.

* * * * *